US007123099B2

(12) United States Patent
Vice

(10) Patent No.: US 7,123,099 B2
(45) Date of Patent: Oct. 17, 2006

(54) TWO-STAGE AMPLIFIER WITH SERIES L-R COUPLING NETWORK

(75) Inventor: Michael W. Vice, El Granada, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 10/667,015

(22) Filed: Sep. 18, 2003

(65) Prior Publication Data

US 2005/0062545 A1 Mar. 24, 2005

(51) Int. Cl.
*H03F 3/04* (2006.01)
(52) U.S. Cl. ...................... 330/311; 330/310
(58) Field of Classification Search ................ 330/311, 330/310, 93, 94, 81, 98, 150, 302, 290
See application file for complete search history.

(56) References Cited

U.S. PATENT DOCUMENTS

| 4,280,103 | A | * | 7/1981 | Poppinga | 330/290 |
| 4,769,714 | A | * | 9/1988 | Osborne | 348/377 |
| 6,255,852 | B1 | * | 7/2001 | Forbes et al. | 326/86 |
| 6,356,461 | B1 | * | 3/2002 | Jacobs | 363/17 |
| 6,704,559 | B1 | * | 3/2004 | Hageraats | 455/326 |

FOREIGN PATENT DOCUMENTS

JP    5-22048    *  1/1993

* cited by examiner

*Primary Examiner*—Henry Choe

(57) ABSTRACT

A two-stage amplifier that includes a first stage and a second stage and a first component and a second component coupled in series between the first and second stages. The first component is selected to provide AC decoupling of the first and second stages and the second component is selected to provide for the stability of the amplifier while avoiding excessive power dissipation and/or negative impact on overall gain.

20 Claims, 1 Drawing Sheet

TWO-STAGE AMPLIFIER WITH SERIES L-R COUPLING NETWORK

BACKGROUND

Two-stage amplifiers may be employed in a variety of electronic applications including electronic circuits in which it is desirable to consume a relatively small amount of electrical power. One type of two-stage amplifier includes a common-source stage and a common-drain stage. An amplifier that includes a common-source stage and a common-drain stage may be referred to as a common-source/common-drain (CS/CD) amplifier.

A two-stage amplifier may include an isolation resistor that provides signal decoupling between its two stages. An isolation resistor may provide isolation of AC signals in the two stages while enabling the passage of DC current between the two stages, thereby enabling power savings. For example, an isolation resistor may be used to decouple the common-source stage from the common-drain stage of a CS/CD amplifier.

Unfortunately, an isolation resistor placed between the stages of a two-stage amplifier may cause an undesirably high level of power loss. For example, the DC current flow between the stages of a two-stage amplifier may cause power dissipation in an isolation resistor. Moreover, an isolation resistor placed between the stages of a two-stage amplifier may reduce the overall gain of the two-stage amplifier.

SUMMARY OF THE INVENTION

A two-stage amplifier is disclosed that includes a first stage and a second stage and a first component and a second component coupled in series between the first and second stages. The first component is selected to provide AC decoupling of the first and second stages and the second component is selected to provide for the stability of the amplifier while avoiding excessive power dissipation and/or negative impact on overall gain.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
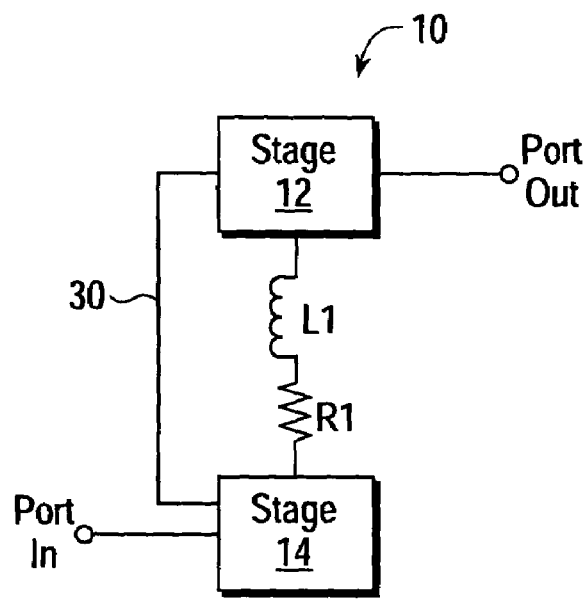
FIG. 1 shows an amplifier according to the present teachings.

FIG. 1 shows an amplifier 10 according to the present teachings. The amplifier 10 includes a pair of stages 12 and 14 that are interconnected via a series L-R network that includes an inductor L1 and a resistor R1. The inductor L1 is selected to provide AC decoupling of the stages 12 and 14, thereby maintaining the gain of the amplifier 10. The resistor R1 is selected to provide for the stability of the amplifier 10. The stages 12–14 have an interstage coupling 30.

In one embodiment, the value of the inductor L1 is selected to be sufficiently large so as to decouple the stages 12 and 14 at the lowest desired operating frequency of the amplifier 10. This yields a value for L1 for which the amplifier 10 gain is maintained down to the lowest frequency of interest. The value of the resistor R1 is increased above zero ohms until the amplifier 10 is unconditionally stable.

Figure 2:
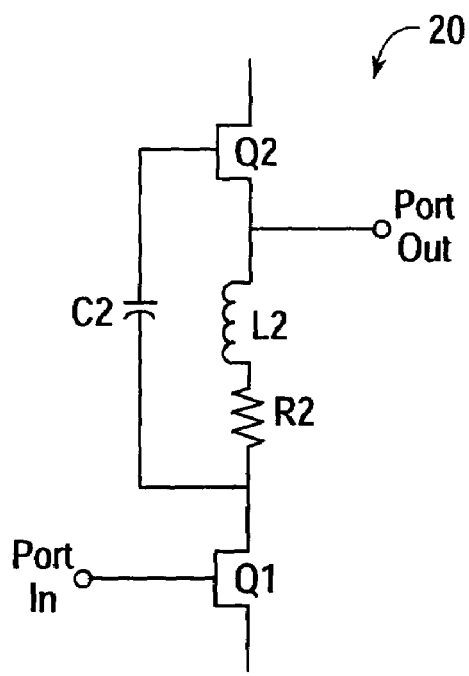
FIG. 2 shows a common-source/common-drain amplifier according to the present teachings.

FIG. 2 shows a common-source/common-drain amplifier 20 according to the present teachings. The amplifier 20 includes a transistor Q2 that is configured as a common-source stage and a transistor Q1 that is configured as a common-drain stage. The amplifier 20 includes a series connected inductor L2 and a resistor R2. The inductor L2 is selected to provide AC decoupling of the common-source and common-drain stages of the amplifier 20 while the resistor R2 is selected to provide stability in the amplifier 20.

The transistors Q1 and Q2 in the embodiment shown are field-effect transistors (FETs). Alternatively, bipolar junction transistors (BJTS) may be used.

The value of the inductor L2 is selected to be sufficiently large so as to decouple the drain of the transistor Q1 from the source of the transistor Q2 at the lowest desired operating frequency of the amplifier 20. The value of the resistor R2 is increased above zero ohms until the amplifier 20 is unconditionally stable.

The resistor R2 works to stabilize the amplifier 20. This is a consequence of the fact that the resistor R2 is in series with a capacitor C2 and the inductor L2 which together act as a feedback network on the transistor Q2. This feedback network is a consequence of the DC current path that is desirable to maintain between the transistors Q1 and Q2 but is not desired for the operation of the amplifier 20. This feedback network provides a positive feedback that creates a possibility for instability of the amplifier 20. Instead, the resistor R2 acts to stabilize the amplifier 20 by inserting a sufficient amount of loss into the feedback on the transistor Q2.

The resistor R2 does not unduly interfere with the operation of the amplifier 20 because it lies in a circuit branch that does not contribute to the gain mechanism of the amplifier 20. This stands in contrast to prior methods of stabilizing an amplifier which place a resistive element either in series with the signal path or in shunt with the signal path.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A two stage amplifier, comprising:
   a first amplifier stage and a second amplifier stage; and
   a first component and a second component coupled in series between the first and second amplifier stages, the first component selected to provide AC decoupling of the first and second amplifier stages and the second component selected to provide for a stability of the two stage amplifier by inserting a loss in a feedback between the first and second amplifier stages.

2. The two stage amplifier of claim 1, wherein the first component is an inductor.

3. The two stage amplifier of claim 2, wherein the inductor has a value that is selected to decouple the first and second amplifier stages.

4. A two stage amplifier, comprising:
   a first amplifier stage and a second amplifier stage; and
   a first component and a second component coupled in series between the first and second amplifier stages, the first component selected to provide AC decoupling of the first and second amplifier stages and the second component selected to provide for a stability of the two stage amplifier, wherein the first component is an inductor having a value selected to decoupled the first and second amplifier stages in response to a lowest desired operating frequency of the two stage amplifier.

5. The two stage amplifier of claim 4, wherein the second component is a resistor.

6. The two stage amplifier of claim 5, wherein the resistor has a value that is selected to maintain the stability of the two stage amplifier.

7. A two stage amplifier, comprising:
a first amplifier stage and a second amplifier stage; and
a first component and a second component coupled in series between the first and second amplifier stages, the first component selected to provide AC decoupling of the first and second amplifier stages and the second component selected to provide for a stability of the two stage amplifier wherein the first and second amplifier stages comprise a common-source amplifier stage and a common-drain amplifier stage.

8. The two stage amplifier of claim 7, wherein the first component is an inductor having a value that is selected to decouple a transistor in the common-source amplifier stage from a transistor in the common-drain amplifier stage.

9. The two stage amplifier of claim 7, wherein the second component is a resistor arranged in series with a capacitor in a feedback circuit for the transistor in common-source amplifier stage.

10. The two stage amplifier of claim 9, wherein the resistor is selected to provide the stability in the two stage amplifier by causing a loss in the feedback circuit.

11. A method for decoupling a first amplifier stage and a second amplifier stage of a two stage amplifier, comprising:
selecting a first component to provide AC decoupling of the first and second amplifier stages;
selecting a second component to provide for a stability of the two stage amplifier by inserting a loss in a feedback between the first and second amplifier stages; and
coupling the first and second component in series between the first and second amplifier stages.

12. The method of claim 11, wherein selecting a first component comprises selecting an inductor.

13. The method of claim 12, wherein the inductor has a value that is selected to decouple the first and second amplifier stages.

14. A method for decoupling a first amplifier stage and a second amplifier stage of a two stage amplifier, comprising:
selecting a first component to provide AC decoupling of the first and second amplifier stages;
selecting a second component to provide for a stability of the two stage amplifier; and
coupling the first and second component in series between the first and second amplifier stages, wherein selecting a first component comprises selecting an inductor having a value that decouples the first and second amplifier stages in response to a lowest desired operating frequency of the two stage amplifier.

15. The method of claim 14, wherein selecting a second component comprises selecting a resistor.

16. The method of claim 15, wherein the resistor has a value that is selected to maintain the stability of the two stage amplifier.

17. A method for decoupling a first amplifier stage and a second amplifier stage of a two stage amplifier, comprising:
selecting a first component to provide AC decoupling of the first and second amplifier stages;
selecting a second component to provide for a stability of the two stage amplifier; and
coupling the first and second component in series between the first and second amplifier stages wherein coupling the first and second component in series between the first and second amplifier stages comprises coupling the first and second component in series between a common-source amplifier stage and a common-drain amplifier stage.

18. The method of claim 17, wherein the first component is an inductor having a value that is selected to decouple a transistor in the common-source amplifier stage from a transistor in the common-drain amplifier stage.

19. The method of claim 17, further comprising coupling the second component in series with a capacitor in a feedback circuit for the transistor in common-source amplifier stage.

20. The method of claim 19, wherein the second component is a resistor that is selected to provide the stability in the two stage amplifier by causing a loss in the feedback circuit.

* * * * *